United States Patent
Gomi et al.

[11] Patent Number: 5,846,867
[45] Date of Patent: Dec. 8, 1998

[54] METHOD OF PRODUCING SI-GE BASE HETEROJUNCTION BIPOLAR DEVICE

[75] Inventors: Takayuki Gomi, Tokyo; Hiroaki Ammo, Kanagawa, both of Japan

[73] Assignee: Sony Corporation, Tokyo, Japan

[21] Appl. No.: 768,171

[22] Filed: Dec. 17, 1996

[30] Foreign Application Priority Data

Dec. 20, 1995 [JP] Japan ................................. 7-331409
Dec. 27, 1995 [JP] Japan ................................. 7-340170

[51] Int. Cl.$^6$ .................................................. H01L 21/331
[52] U.S. Cl. .......................... 438/318; 438/312; 438/513; 438/514; 438/563; 438/564; 148/DIG. 10; 148/DIG. 58; 148/DIG. 59; 148/DIG. 72; 257/198; 257/592; 257/593
[58] Field of Search .......................... 438/309, 312–318, 438/513, 514, 563, 564, 165, 249, 266, 291, 306, 320, 322, 324; 148/DIG. 10, DIG. 11, DIG. 58, DIG. 59, DIG. 72; 257/197, 198, 592, 593

[56] References Cited

U.S. PATENT DOCUMENTS

| | | | |
|---|---|---|---|
| 4,912,065 | 3/1990 | Mizuno et al. | 437/141 |
| 5,296,391 | 3/1994 | Sato et al. | 437/31 |
| 5,323,032 | 6/1994 | Sato et al. | 257/198 |
| 5,424,228 | 6/1995 | Imai | 437/31 |
| 5,494,836 | 2/1996 | Imai | 437/31 |
| 5,504,018 | 4/1996 | Sato | 437/31 |
| 5,663,097 | 9/1997 | Sakamoto et al. | 438/372 |

*Primary Examiner*—John Niebling
*Assistant Examiner*—Long Pham
*Attorney, Agent, or Firm*—Hill & Simpson

[57] ABSTRACT

A method of producing a bipolar transistor includes the step of forming an emitter contact layer containing a high concentration of impurity by means of plasma doping or solid-state diffusion without causing diffusion of impurity in a base layer. This makes it possible to realize a thin base layer having a high impurity concentration.

The invention also provides a method of producing a semiconductor device including a bipolar transistor and another device element such as a resistor element including a polysilicon layer containing an activated impurity in such a manner that both the bipolar transistor and the device element are disposed on the same single substrate, the method including the steps of: forming a polysilicon layer containing an activated impurity on the surface of a substrate; and then forming a base layer of the bipolar transistor. This method prevents the base layer from being affected by heat treatment on the polysilicon layer.

5 Claims, 9 Drawing Sheets

METHOD OF PRODUCING SI-GE BASE HETEROJUNCTION BIPOLAR DEVICE

BACKGROUND OF THE INVENTION

1. Field of the Invention

The present invention relates to a method of producing a bipolar transistor, and also to a method of producing a semiconductor device including a bipolar transistor and a device element including a polysilicon layer containing an activated impurity wherein both the bipolar transistor and the device element are formed on the same substrate.

2. Description of the Related Art

To improve the operating speed of a bipolar transistor, it is essentially important that the base layer be thin enough and have a sufficiently high impurity concentration. The ion implantation technique is widely used to form a base layer. However, this technique has a problem of ion channeling, which limits the minimum thickness of the base layer to about 40 nm.

One known technique to avoid the above problem is to form a base layer using an epitaxial technique which inherently has no problem of channelling. With this technique, it is possible to form a base layer having a thickness smaller than 30 nm and having a high enough impurity concentration by incorporating an impurity into the base layer during the epitaxial growth process. Using this technique, a high-speed bipolar transistor having a maximum cut-off frequency $f_{Tmax}$ as high as 50 GHz has been realized.

Although the bipolar transistor fabricated with the above technique has such the high maximum cut-off frequency $f_{Tmax}$, its high base resistance (Rb) limits the maximum frequency of oscillation $f_{max}$ to 30–40 GHz.

To further increase the impurity concentration of the base layer to reduce the base resistance (Rb), it is required to increase not only the impurity concentration of the base layer but also that of the emitter layer so that a sufficiently high current gain (hFE) can be obtained.

However, the further increase in the impurity concentration of the emitter can cause a reduction in bandgap which in turn results in a reduction in the injection efficiency, a reduction in the emitter-base breakdown voltage, and an increase in the emitter-base junction charging time constant $\tau_{EB}$. Since the requirements among these parameters conflict with each other, there is a limitation in the improvement in the operating speed.

The above conflict can be avoided by employing a heterojunction between the emitter and base in which the bandgap of the emitter is different from that of the base. For example, silicon germanium (SiGe) having a narrower bandgap than silicon is used as a base material so as to form a practical heterojunction. In the heterojunction structure, the emitter can inject a greater number of carriers into the base than the emitter of the homogeneous junction structure. This makes it possible to achieve a sufficiently high current gain $f_{FE}$ without increasing either the base resistance (Rb) or the emitter-base junction charging time constant $\tau_{EB}$, and thus it is possible to realize a high-speed bipolar transistor having a maximum frequency of oscillation $f_{max}$ as high as about 50 GHz.

To fabricate a heterojunction bipolar transistor, it is important to control the distributions of p-type impurity and germanium (Ge) across the base layer so that the heterojunction is formed at the same location as the p-n junction. If the location of the heterojunction is not coincident with that of the p-n junction, a parasitic conduction barrier is formed which results in a reduction in the current gain ($h_{FE}$) and the Early voltage.

With reference to FIG. 1, a conventional method of producing a junction bipolar transistor will be described below.

As shown in FIG. 1A, an n⁺ buried collector layer 112 is formed on the surface of a silicon substrate 111 by means of solid-state diffusion. An epitaxial layer 113 with an impurity concentration of $5 \times 10^{16}$ atoms/cm³ is then epitaxially grown thereon by means of an epitaxial growth technique. The epitaxial layer 113 is locally oxidized (for example by the LOCOS (local oxidation of silicon) method so as to form a device isolation oxide film 114. The surfaces of the epitaxial layer 113 and the device isolation oxide film 114 are planarized. An ion implantation process is then performed so that a p⁺ device isolation diffusion layer 115 is formed under the device isolation oxide film 114. Another ion implantation process is performed to form an n⁺ collector contact diffusion layer 116 connected to the n⁺ buried collector layer 112.

Then as shown in FIG. 1B, a 30 nm thick silicon germanium ($Si_{0.8}Ge_{0.2}$) film containing boron (B) acting as a p-type impurity with a concentration of about $3 \times 10^{19}$ atoms/cm³ is formed over the entire surface area of the epitaxial layer 113.

A 50 to 80 nm thick silicon film containing an n-type impurity with a concentration of about $3 \times 10^{18}$ atoms/cm³ is then formed thereon.

Ion implantation and activation annealing are then performed so as to dope the surface region of the emitter layer 118 with an n-type impurity to a high concentration (for example in the range from $1 \times 10^{20}$ atoms/cm³ to the solid solubility level) thereby forming an emitter contact layer 119. The activation annealing should be performed in the range from about 850° C. to 900° C. A base and an emitter on the base are then formed by means of a patterning technique.

Subsequently, as shown in FIG. 1C, an interlayer insulating film 121 is formed and then contact holes 122, 123, and 124 are formed in the interlayer insulating film 121. Electrodes 125, 126, and 127 are then formed such that these electrodes are in contact with the base layer 117, the emitter contact layer 119, and the collector contact diffusion layer 116, respectively, through the contact holes 122, 123, and 124.

In another (second) conventional technique, the base layer, the emitter layer, and the emitter contact layer are formed by means of a low-temperature epitaxial growth process.

In a still another (third) conventional technique, after epitaxially forming the base layer and the emitter layer, an n-type impurity regions is formed by means of an ion implantation process.

In the first conventional technique, however, if the base layer is subjected to a heat treatment at a temperature higher than 800° C., diffusion of boron (B) and germanium (Ge) in the base layer occurs. If such the diffusion occurs, the base width will be expanded and discrepancy in position between the heterojunction and the p-n junction will occur. Furthermore, since the base layer of silicon germanium (SiGe) has a thickness greater than the critical film thickness determined by the thermal equilibrium theory, the high-temperature heat treatment will cause generation of dislocations, which will result in an increase in leakage current.

As shown in FIG. 2, immediately after the formation of the base layer by means of the epitaxial growth technique, it has a boron concentration distribution limited within a narrow range represented by a broken line, which is coincident with the range of the silicon germanium mixed crystal. However, boron atoms (B) diffuse during heat treatment performed after the formation of the base layer. As a result, the boron distribution is spread as represented by a solid line. Thus, the heat treatment causes an increase in the base width, which makes it difficult to achieve a high-speed operation. In FIG. 2, the vertical axis represents the impurity concentration, and the horizontal axis represents the depth across the emitter, the base, and the collector.

In the second example of the conventional technique described above, when the epitaxial growth is performed at a low temperature below 800° C., the surface of silicon becomes chemically more inactive due to adsorption of group V element with the increase in the concentration of n-type impurity contained in the ambient in which the epitaxial growth is performed. This leads to a great reduction in the growth rate to a level which is too low for practical production.

On the other hand, in the third conventional technique, heat treatment at a rather high temperature is required to activate the implanted ions and to remove damage induced in the crystal during the ion implantation process. During the crystal annealing process, interstitial silicon atoms are generated, which can result in an increase in the diffusivity of boron (B) by two or more orders of magnitude.

The generation of interstitial silicon atoms in the ion implantation process is also a problem when an emitter is formed of polysilicon. If in-situ doped polysilicon is employed, the problem of enhanced diffusion of boron (B) due to the generation of interstitial silicon can be avoided. However, it is difficult to grow polysilicon on silicon without having a native oxide layer at the interface between the silicon and the polysilicon. The formation of the native oxide results in an increase in the emitter resistance.

Furthermore, when a bipolar transistor having a shallow base layer is formed together with another type of device such as a MOS transistor on the same substrate if polysilicon is employed to form the gate electrode of the MOS transistor, and the emitter, base and collector electrodes of the bipolar transistor as well as a resistor element, the polysilicon is required to be doped with an impurity to a high enough concentration, and the impurity atoms have to be activated by high-temperature heat treatment.

However, the impurities incorporated into the Si and SiGe films can diffuse during the high-temperature heat treatment. Thus, even if the above thin films are formed by means of the epitaxial technique, the high-temperature heat treatment leads to changes in the impurity profiles. Thus the effective thicknesses of the films become different from their original thicknesses.

When an SiGe film is employed as the base layer, since the lattice constant of Ge is 4% greater than that of Si, an internal stress occurs at the interface between the Si substrate and the SiGe film formed on the Si substrate. Therefore, if heat treatment is performed after forming the SiGe film on the Si substrate, a plastic strain occurs in the SiGe film so that the above internal stress is relaxed. As a result, lattice defects are created in the SiGe film. Since the above internal stress increases with the Ge content, the resistance to the heat treatment decreases with the Ge content.

On the other hand, the bandgap decreases with the Ge content.

As can be understood from the above discussion, the advantages of the shallow base layer (of SiGe or Si) formed by means of the epitaxial technique are lost by the heat treatment performed on the substrate after the formation of the shallow base layer.

SUMMARY OF THE INVENTION

It is a general object of the present invention to solve the above problems. More specifically, it is an object of the present invention to provide a method of producing a bipolar transistor and also a method of producing a semiconductor device including a bipolar transistor and another device element including a polysilicon layer containing an activated impurity wherein both the bipolar transistor and the device element are formed on the same substrate.

According to one aspect of the present invention, there is provided a method of producing a bipolar transistor, including the steps of: forming a first conductivity type semiconductor film to be used as a base layer, on a semiconductor substrate; forming a second conductivity type semiconductor layer to be used as an emitter layer, on the first conductivity type semiconductor layer; and doping the surface region of the second conductivity type semiconductor layer with an impurity by means of plasma doping thereby forming a high-impurity-concentration layer of the second conductivity type whose impurity concentration is higher than that of the second conductivity type semiconductor layer.

According to another aspect of the present invention, there is provided a method of producing a bipolar transistor, including the steps of: forming a first conductivity type semiconductor film to be used as a base layer, on a semiconductor substrate; forming a second conductivity type semiconductor layer to be used as an emitter layer, on the first conductivity type semiconductor layer; and doping the surface region of said second conductivity type semiconductor layer with an impurity by means of solid-phase diffusion from a layer containing a second conductivity type impurity thereby forming a high-impurity-concentration layer of the second conductivity type whose impurity concentration is higher than that of said second conductivity type semiconductor layer.

In this method of producing a bipolar transistor, the emitter contact layer having a high impurity concentration is formed at a low temperature by means of the plasma doping or solid-state diffusion without having to perform high-temperature heat treatment which can result in diffusion of impurities such as boron in the base layer.

According to still another aspect of the present invention, there is provided a method of producing a semiconductor device including a bipolar transistor and a device element including a polysilicon layer containing an activated impurity, the bipolar transistor and the device element being disposed on the same single substrate, the method being characterized in that the base layer of the bipolar transistor is formed on the substrate after completion of the step of forming the polysilicon layer on the substrate.

In this method of the invention, since the base layer of the bipolar transistor is formed after the formation of the polysilicon layer on the substrate, the base layer can be formed on the substrate without being affected by the process of forming the polysilicon layer containing the activated impurity. In other words, it is possible to heat the polysilicon layer to activate the impurity contained therein without affecting the base layer. Thus, the crystallinity and impurity profile of the base layer are maintained unchanged in the state as formed.

According to a further aspect of the present invention, there is provided a method of producing a semiconductor device including a bipolar transistor and a device element including a polysilicon layer containing an activated impurity, the bipolar transistor and the device element being disposed on the same single substrate, the method being characterized in that the polysilicon layer is formed either by first depositing a polysilicon film containing an activated impurity and then patterning this polysilicon film or by first performing plasma doping so as to incorporate an activated impurity into a polysilicon film which has been deposited previously and then patterning this polysilicon film. In this method, the polysilicon film containing activated impurity atoms can be formed without having to perform an additional activation annealing process. This makes it possible to form a polysilicon layer after the formation of a bipolar transistor without changing the crystallinity and impurity profile of the respective layers which have already been formed.

BRIEF DESCRIPTION OF THE DRAWINGS

FIG. 1A–1G is a schematic representation of the processing steps of producing a semiconductor device according to a conventional technique;

DESCRIPTION OF THE PREFERRED EMBODIMENTS

A first embodiment of the present invention will be described below with reference to FIGS. 3, 4, and 5.

FIG. 3 illustrates the production process which characterizes the present invention, while FIG. 4 illustrates the process performed before the process shown in FIG. 3, and FIG. 5 illustrates the process performed after the process shown in FIG. 3.

Figure 4A:
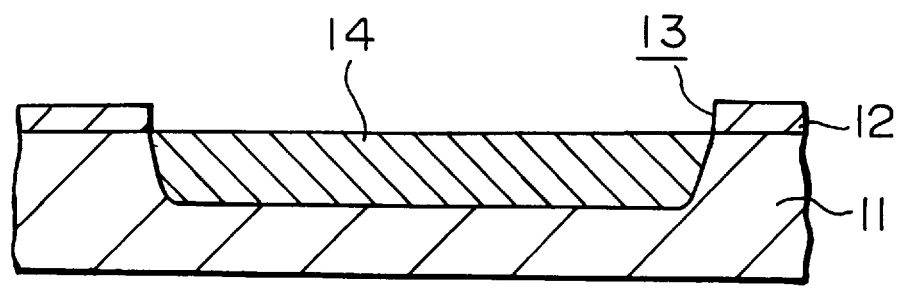
FIG. 4A–4B is a schematic representation of the processing steps of producing a semiconductor device according to the first embodiment of the present invention.

First, as shown in FIG. 4A, a <100> silicon substrate 11 of a first conductivity type (hereafter assumed to be p-type) is subjected to thermal oxidation so as to form a silicon oxide film 12 having a thickness of for example 330 nm on the silicon substrate 11. An opening 13 is formed in the silicon oxide film 12 at the location corresponding to the region which will become a collector later. The formation of the opening 13 is accomplished by a lithography technique (including the steps of coating a resist film and then exposing, developing, and baking it) and a dry etching technique using the resist film (not shown) as an etching mask. The resist film is then removed by ashing and cleaning processes.

The surface area of the silicon substrate 11 exposed through the opening 13 is doped with antimony by means of solid-state diffusion from antimony oxide ($Sb_2O_3$) so that an buried $n^+$-type collector region 14 of a second conductivity type (herein assumed to be n-type) is formed in the upper surface region of the silicon substrate 11. In the above process, the silicon oxide film 12 serves as a mask against the solid-state diffusion.

Typical conditions for the above solid-state diffusion are as follows:

Diffusion temperature; 1200° C.

Diffusion time: 1 hour

The silicon oxide film 12 is then removed by an etching process.

Figure 4B:
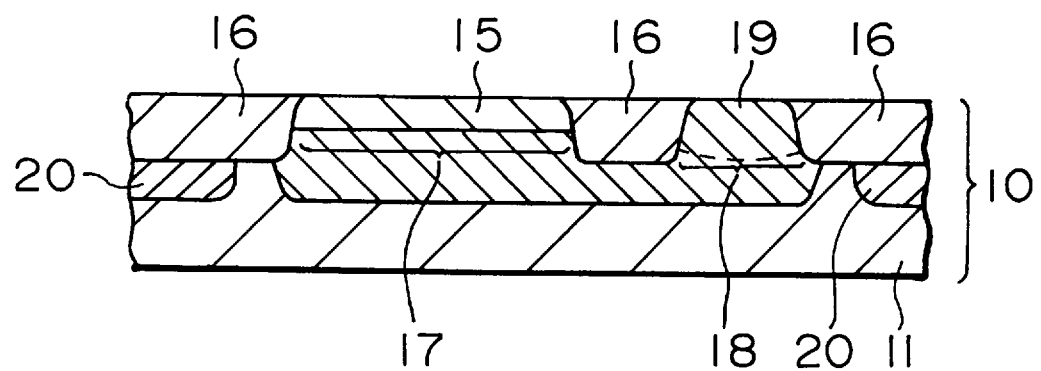

Subsequently, an n-type epitaxial layer 15 is formed on the silicon substrate 11, as shown in FIG. 4B, using a common epitaxial growth technique. Preferably, the epitaxial layer 15 has a thickness of 0.5 µm to 1.5 µm and a sheet resistance of 0.1 Ωcm to 1.0 Ωcm.

Thermal oxidation is then performed so that a silicon oxide film (not shown) having a thickness of for example 50 nm is formed on the surface of the epitaxial layer 15. A silicon nitride ($Si_3N_4$) film (not shown) having a thickness of for example 100 nm is further formed thereon by means of chemical vapor deposition (CVD).

The above epitaxial layer 15 is etched to a depth corresponding to about half the thickness of a device isolation region which will be formed later. The etched region is then partially oxidized (by means of for example the LOCOS (local oxidation of silicon) technique) thereby forming a device isolation region 16 having a thickness of for example 800 nm. As a result of the above processing steps, the substrate 10 has the structure shown in FIG. 4B.

The device isolation region 16 serves to isolate an active region 17 from a collector contact region 18.

The silicon nitride film (not shown) used in the above-descried local oxidation process is removed by etching.

A lithography process (including the steps of coating a resist film and then exposing, developing, and baking it) is performed to form a resist mask having an opening (not shown) at the location corresponding to the collector contact region 18. Ion implantation is then performed using the above resist mask thereby doping the silicon substrate 11 with an n-type impurity.

Typical ion implantation conditions are as follows:

Implantation impurity: Phosphorus ions ($P^+$)

Ion implantation energy: 70 keV

Dose: $5 \times 10^{15}$ ions/cm$^2$

After the ion implantation, heat treatment is performed so that an $n^+$-type sinker region 19 is formed in the epitaxial layer 15 in such a manner that the $n^+$-type sinker region 19 is contact with the buried collector region 14.

Typical conditions for the above heat treatment are as follows:

Heat treatment temperature: 1000° C.

Heat treatment time: 30 min

Using a known technique, the device isolation region 16 is planarized by removing the so-called bird's head on the device isolation region 16 formed in the above-described local oxidation process.

A lithography process (including the steps of coating a resist film and then exposing, developing, and baking it) is performed to form a resist mask having an opening (not shown) at the location corresponding to the region where a device isolation diffusion layer with be formed later. Using this resist mask, ion implantation is performed to form a device isolation diffusion layer 20 under the device isolation region 16.

Typical ion conditions for the above implantation are as follows:

Implantation impurity: Boron ions ($B^+$)
Ion implantation energy: 200 to 500 keV
Dose: $1 \times 10^{13}$ to $1 \times 10^{15}$ ions/cm$^2$ An etching process is then performed to remove the silicon oxide film (not shown) which has been formed on the active region 17 so as to serve as the mask of the local oxidation described above.

Figure 1A:
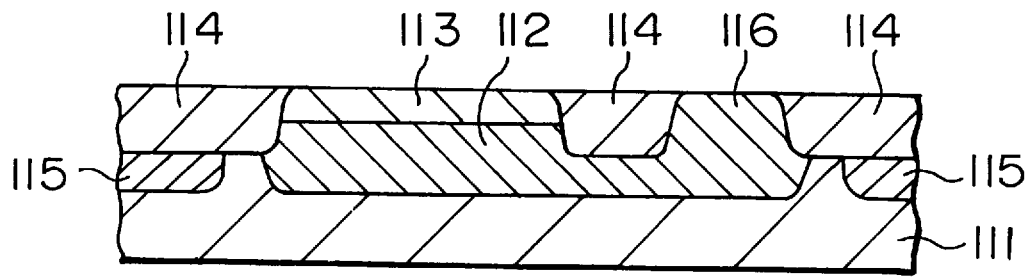
Figure 1B:
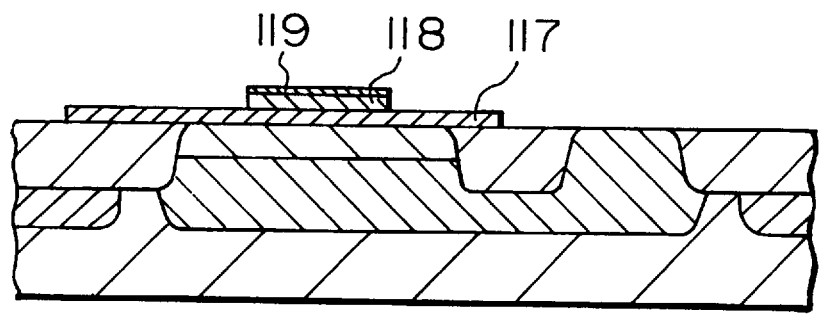
Figure 1C:
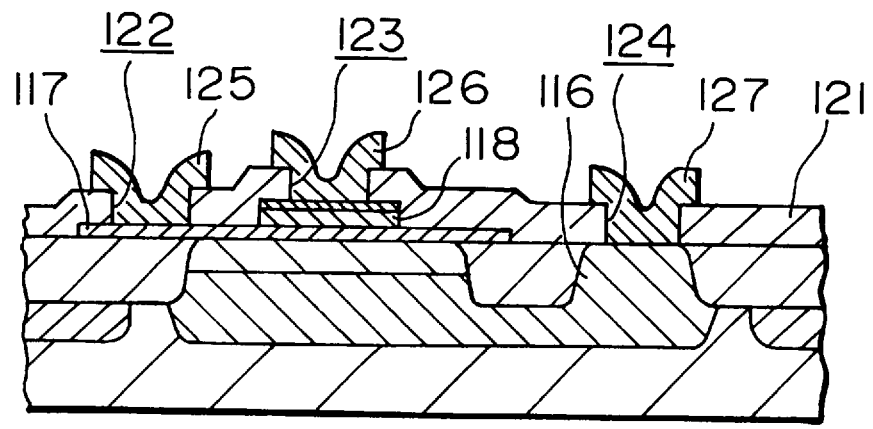
Figure 2:
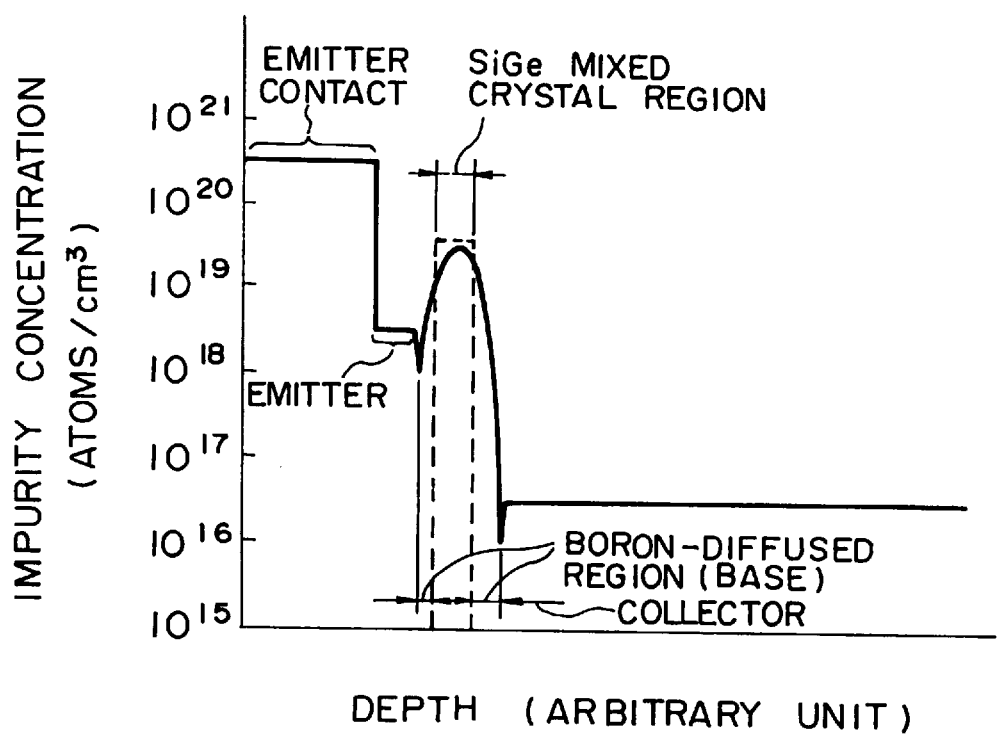
FIG. 2 is a graph illustrating an impurity profile.
Figure 3A:
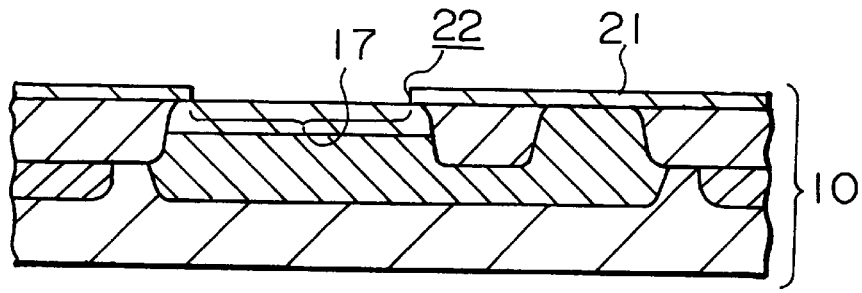
FIG. 3A–3D is a schematic representation of the processing steps of producing a semiconductor device according to a first embodiment of the present invention.

Over the entire area of the surface of the substrate 10 exposed after the removal of the silicon oxide film, a p$^+$-type polysilicon film 21 is formed to a proper thickness in the range for example from 20 nm to 80 nm by means of CVD, as shown in FIG. 3A.

The polysilicon film 21 is then doped with a p-type impurity by means of ion implantation.

Typical conditions for the above ion implantation are as follows:

Implantation impurity: Boron difluoride ions ($BF_2^+$)
Ion implantation energy: 20 to 80 keV
Dose: $5 \times 10^{14}$ to $7 \times 10^{15}$ ions/cm$^2$ Alternatively, the impurity may also be incorporated in situ into the polysilicon film 21 during the growth process.

The polysilicon film 21 serves to reduce the resistance of the base contact electrode region. The polysilicon film 21 also ensures that hydrogen passivation is properly made in the hydrofluoric acid cleaning process performed later.

A lithography process (including the steps of coating a resist film and then exposing, developing, and baking it) and then etching are performed to form an opening 22 in the above polysilicon film 21 at the location corresponding to the active region 17.

Figure 3B:
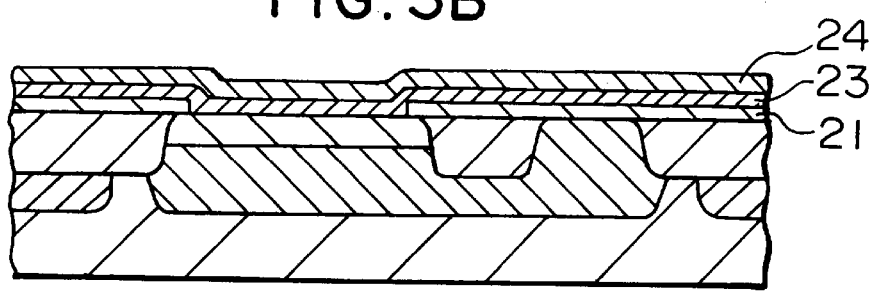

As shown in FIG. 3B, the entire surface is cleaned with hydrofluoric acid thereby performing hydrogen passivation.

Subsequently, a p$^+$-type silicon germanium film 23 and then an n$^-$-type silicon film 24 are successively formed on the entire surface of the polysilicon film 21 by means of ultra-high vacuum CVD, molecular beam epitaxial growth, or reduced-pressure CVD technique.

In the case where the reduced-pressure CVD technique is employed, pre-baking is performed as required for example in a hydrogen ambient at 1000° C. for 10 min, and then a p$^+$-type silicon germanium film 23 serving as the semiconductor film of the first conductivity type to be used as the base layer is formed for example under the following conditions:

Reaction gases: Dichlorosilane ($SiH_2Cl_2$) +Monogermane ($GeH_4$)+Diborane ($B_2H_6$)
Deposition ambient pressure: 8 kPa
Deposition temperature: 700° C.

Under the above deposition conditions, the p$^+$-type silicon germanium film 23 is formed to a proper thickness in the range from 20 nm to 80 nm.

In the above film deposition, boron (B) doping is performed to a concentration level in the range from $5 \times 10^{18}$ atoms/cm$^3$ to $5 \times 10^{19}$ atoms/cm$^3$, and the composition ratio of germanium of the silicon germanium mixed crystal is selected within the range from 5 atomic % to 20 atomic %.

An n$^-$-type silicon film 24 serving as the semiconductor film of the second conductivity type to be used as the emitter layer is formed by means of CVD for example under the following conditions:

Reaction gases: Monosilane ($SiH_4$)+Phosphine ($PH_3$)
Deposition ambient pressure: 8 kPa
Deposition temperature: 750° C.

Under the above deposition conditions, the n$^-$-type silicon film 24 is formed to a proper thickness in the range from 100 nm to 200 nm.

In the above film deposition, phosphorus (P) doping is performed to a concentration in the range from $1 \times 10^{18}$ atoms/cm$^3$ to $1 \times 10^{19}$ atoms/cm$^3$. In the deposition of both the p$^+$-type silicon germanium films 23 and the n$^-$-type silicon film 24, single-crystal silicon is grown in the area where the underlying layer is single-crystal silicon while polysilicon is grown in the area where the underlying layer is polysilicon.

Figure 3C:
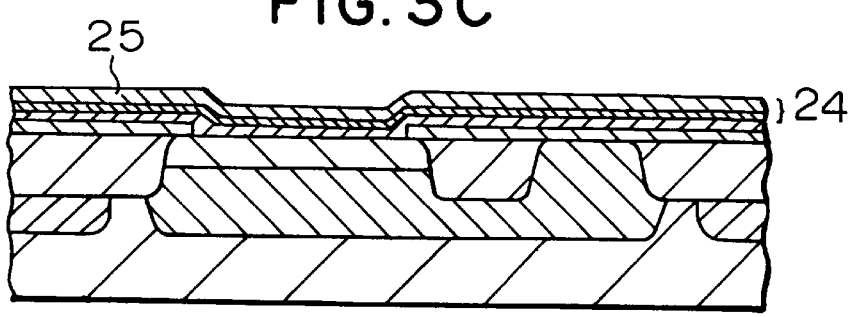

As shown in FIG. 3C, plasma-doping is performed so that the surface region of the n-type silicon film 24 is heavily doped with a group V element thereby forming an n$^-$-type silicon layer 25 having a proper thickness in the range from 50 nm to 150 nm and having an impurity concentration in the range from $5 \times 10^{19}$ atoms/cm$^3$ to $5 \times 10^{21}$ atoms/cm$^3$ and more preferably in the range from $1 \times 10^{20}$ atoms/cm$^3$ to $2 \times 10^{21}$ atoms/cm$^3$.

The above plasma-doping may be accomplished for example under the following conditions:

Doping gas: Phosphine ($PH_3$) diluted in helium (He)
Doping ambient pressure: 5 Pa In the doping process, a plasma is generated by glow discharging and the ionized doping gas is accelerated in an ion sheath (not shown) thereby doping the surface region of the n$^-$-type silicon film 24, which acts as a cathode, with the n-type impurity to an impurity level of $1 \times 10^{21}$ atoms/cm$^3$ so that the doped region has a thickness of 80 nm.

With the above plasma doping technique, it is possible to dope the silicon to a high impurity level at a low temperature in the range from 200° C. to 600° C. without having the problem of the broadening of the base width due to the diffusion of boron (B) or germanium (Ge) in the silicon germanium base layer 23 and thus without having the problem of deviation in position between the heterojunction and the p-n junction. Furthermore, the problem of enhanced diffusion of boron (B) due to the generation of interstitial silicon can be avoided. No plastic strain occurs in the silicon germanium (SiGe) mixed crystal, and thus no dislocation is created.

Figure 3D:
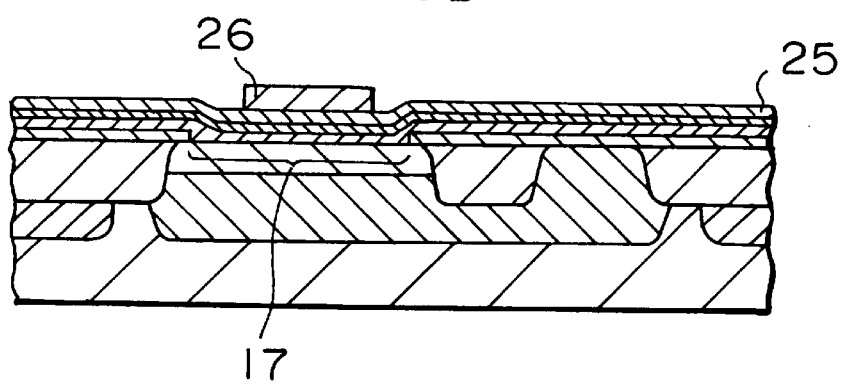

Then as shown in FIG. 3D, a silicon oxide film with a thickness of for example 100 nm is formed by means of CVD over the entire surface area of the n$^+$-type silicon layer 25. A lithography process (including the steps of coating a resist film and then exposing, developing, and baking it) and then etching are performed to remove the silicon oxide film except the area above the active region 17 in which an emitter will be formed later, thereby forming a silicon oxide pattern 26. In the above process, the silicon oxide pattern 26 is formed in such a manner that the resultant pattern is present only above the single-crystal region and no pattern is present on the polycrystalline region.

Figure 5A:
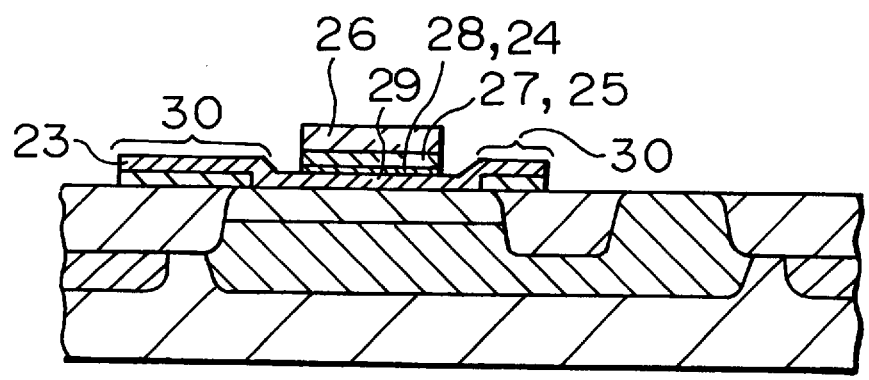
FIG. 5A–5B is a schematic representation of the processing steps of producing a semiconductor device according to the first embodiment of the present invention.

By means of wet etching using a mixed solution of potassium hydrate (KOH) and potassium carbonate ($K_2CO_3$) as an etchant, the n$^+$-type silicon layer 25 and the n$^-$-type silicon layer 24 are patterned using the above silicon oxide pattern 26 as the etching pattern thereby forming an emitter contact layer 27 with the n$^+$-type silicon layer 25 and also forming an emitter layer 28 with the n$^-$-type silicon layer 24, as shown in FIG. 5A.

In the above wet etching process, the ratio of the etching rate for the silicon layer to that for the silicon germanium (SiGe) is as high as 20 to 30. This allows the silicon layers to be etched without significant over etching of the silicon germanium film 23.

The silicon oxide pattern 26 is then removed by means of wet etching using a hydrofluoric acid-based etchant.

A lithography process (including the steps of coating a resist film and then exposing, developing, and baking it) and then etching are performed to pattern the p$^+$-type silicon germanium film 23 and the p$^+$-type polysilicon film 21 thereby forming a base layer 29 on the active region 17 and also forming a base contact electrode 30 extending from the base layer 29.

Figure 5B:
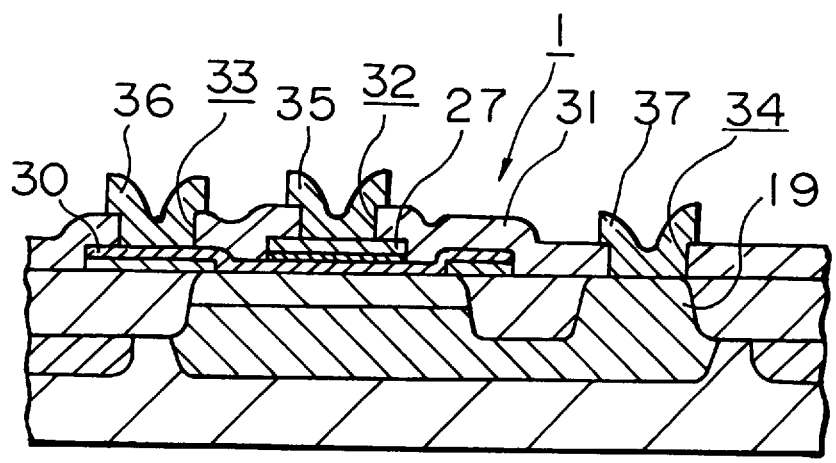

A CVD process is performed to deposit a silicon oxide film 31 to a thickness of for example 300 nm to 500 nm over the entire surface area of the emitter contact layer 27, as shown in FIG. 5B. A lithography process (including the steps of coating a resist film and then exposing, developing, and baking it) and then etching are performed to form an emitter electrode contact hole 32, a base electrode contact hole 33, and a collector electrode contact hole 34 in the above silicon oxide film 31.

Subsequently, a barrier metal layer and a metal interconnection layer are successively deposited and then patterned to form an emitter electrode 35 connected to the emitter contact layer 27 via the emitter electrode contact hole 32, a base electrode 36 connected to the base contact electrode 30 via the base electrode contact hole 33, and a collector electrode 37 connected to the n$^+$-type sinker region 19 via the collector electrode contact hole 34.

Since the emitter contact layer 27 has an impurity concentration as high as $1 \times 10^{20}$ atoms/cm$^3$, an ohmic contact is formed between the emitter electrode 35 and the emitter contact layer 27.

Thus, a bipolar transistor 1 having a thin base layer 29 with a high impurity concentration can be realized according to the above-described process of the present invention.

In this fabrication process of the bipolar transistor 1, as described above, the emitter contact layer 27 is doped to a high impurity level at a rather low temperature by means of plasma doping without having to perform high-temperature heat treatment which can result in diffusion of impurities such as boron (B) and germanium (Ge) in the p$^+$-type silicon germanium layer 23 to be used as the base layer 29. Thus, the emitter contact layer 27 can be formed without causing significant diffusion of impurities in the P$^+$-type silicon germanium film 23.

A second embodiment of the present invention will be described below with reference to FIG. 6 in which similar parts or elements to those in FIGS. 3–5 are denoted by similar reference numerals. In this second embodiment, the emitter contact layer is formed by means of solid-state diffusion.

In this second embodiment, the process steps from the beginning to the step of forming a semiconductor film of the second conductivity type or an n$^-$-type silicon film 24 to be used as an emitter layer are performed in the same manner as in the first embodiment described above with reference to FIGS. 4, 3A, and 3C.

Figure 6A:
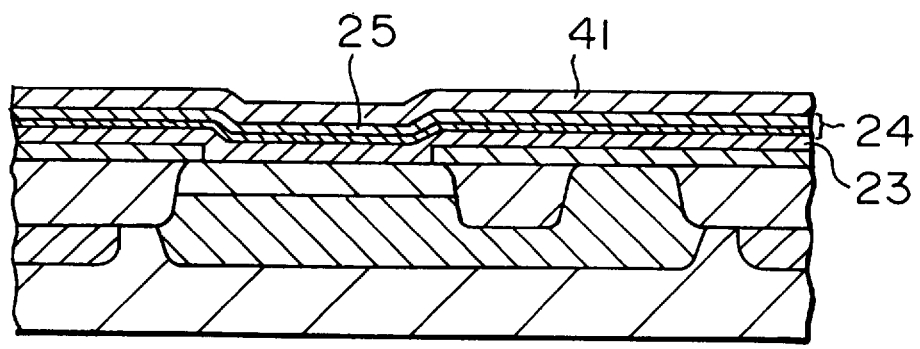
FIG. 6A–6B is a schematic representation of the processing steps of producing a semiconductor device according to a second embodiment of the present invention.

After that, as shown in FIG. 6A, a phosphorus-doped SOG (spun-on glass) dielectric film 41 is coated on the n$^-$-type silicon film 24 to a proper thickness in the range from 100 nm to 150 nm. Since phosphorus (P) serves as a second conductivity type impurity, the resultant SOG film 41 contains a second conductivity type impurity. The SOG film 41 is then baked at a proper temperature in the range from 200° C. to 400° C. The SOG film 41 is then illuminated by a halogen lamp in a nitrogen (N$_2$) ambient so that it is heated to a temperature in the range from 500° C. to 750° C. and more preferable in the range from 600° C. to 700° C. More specifically, heating is performed for example at 650° C. for 30 min so that phosphorus (P) atoms contained in the phosphorus-doped SOG film 41 diffuse into the surface region of the n$^-$-type silicon film 24 thereby forming a heavily-doped region with an impurity concentration of $2 \times 10^{20}$ atoms/cm$^3$ at the surface of the n$^-$-type silicon film 24. The resultant heavily-doped region serves as the n$^+$-type silicon layer 25.

With the above solid-state diffusion technique, it is possible to dope the silicon layer 25 to a high impurity level at a low temperature below 750° C. without having the problem of the broadening of the base width due to the diffusion of boron (B) or germanium (Ge) in the base layer 23 of silicon germanium and thus without having the problem of deviation in position between the heterojunction and the p-n junction. Furthermore, the problem of enhanced diffusion of boron (B) due to the generation of interstitial silicon can be avoided. No plastic strain occurs in the silicon germanium (SiGe) mixed crystal, and thus the high crystal quality is maintained without generating dislocations.

Figure 6B:
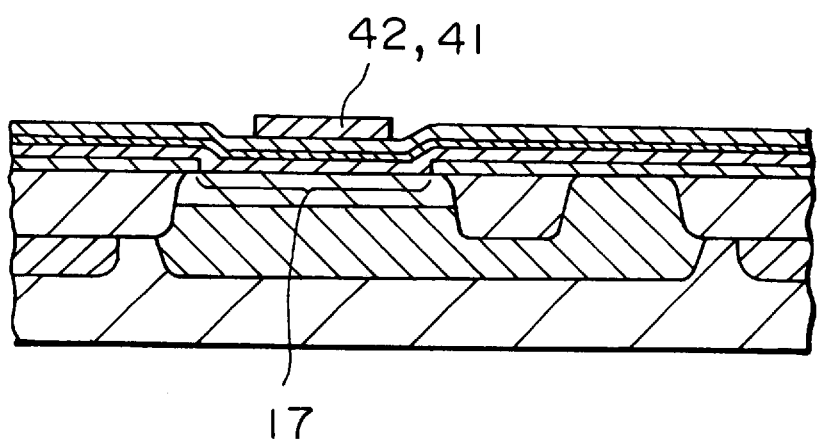

After that, as shown in FIG. 6B, a lithography process (including the steps of coating a resist film and then exposing, developing, and baking it) and then etching are performed to pattern the SOG film 41 thereby forming a silicon oxide pattern 42 of the SOG film 41 on the region to be formed into an emitter in the active region 17. The resultant silicon oxide pattern 42 of this second embodiment corresponds to the silicon oxide pattern 26 of the first embodiment described above. In the above patterning process, the silicon oxide pattern 42 is formed in such a manner that the resultant pattern is present only above the single-crystal region and no pattern is present on the polycrystalline region.

The following processing steps are performed in the same manner as in the first embodiment described above.

The heat treatment for forming the n$^+$-type silicon layer 25 may be performed at a processing stage after completion of the step of forming the silicon oxide pattern 42 with the SOG film 41 used as the etching mask, or after completion of the step of forming the heavily-doped emitter contact layer 27, or otherwise after completion of the step of forming the emitter layer 28.

In this second embodiment, as described above, the n$^+$-type silicon layer 25 serving as the heavily-doped emitter contact layer is formed at a rather low temperature by means of the solid-state diffusion without having to perform high-temperature heat treatment which can result in diffusion of impurities such as boron (B) and germanium (Ge) in the p$^+$-type silicon germanium layer 23 serving as the base layer. Thus, the emitter contact layer 27 can be formed while suppressing the diffusion of impurities in the p$^+$-type silicon germanium film 23.

In this second embodiment, the SOG film 41 used in the doping process can also be used as the mask during the wet etching process, and thus, unlike the first embodiment described earlier in which the silicon oxide film for use as the mask has to be formed, the processing step of forming such the additional silicon oxide film is no longer needed. This allows a reduction in the number of processing steps.

In this second embodiment, the processing step of forming by means of the solid-state diffusion the emitter contact layer at the surface of the emitter layer such that it has an impurity concentration higher than that of the emitter layer may also be performed either after forming the silicon oxide pattern 42 of the SOG film 41, or after patterning the n$^-$-type silicon film 24 into the emitter layer using the silicon oxide pattern 42 as the etching mask.

Although in the above embodiments the heterojunction bipolar transistor is assumed to be of the npn type, the present invention may also be applied to a pnp-type heterojunction bipolar transistor. In this case, however, the conductivity types of the respective layers should be inverted.

FIG. 7 illustrates the processing steps of fabricating a semiconductor device according to a third embodiment of the present invention. In the present embodiment, the semiconductor device is formed on the primary surface of a silicon substrate 311 as shown in FIG. 7F. First, the process of forming the substrate 311 will be described below. By way of an example, an npn bipolar transistor and a polysilicon resistor element are formed on the same single substrate.

Figure 7A:
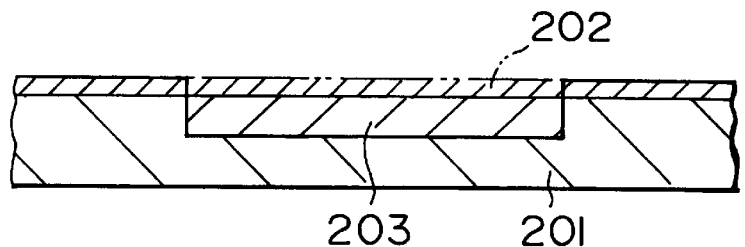
FIG. 7A–7J is a schematic representation of the processing steps of producing a semiconductor device according to a third embodiment of the present invention.

As shown in FIG. 7A, a p-type <100> silicon substrate (hereafter referred to simply as a silicon substrate) 201 is prepared, and thermal oxidation is performed to form a silicon oxide film 202 having a thickness of about 300 nm on the surface of the silicon substrate 201. The silicon oxide film 202 is etched using a resist pattern (not shown) as a mask in such a manner as to form an opening at the location corresponding to the region (represented by the two-dot chain line) in which an n$^+$ buried layer of the bipolar transistor will be formed.

The surface of the silicon substrate 201 in the area exposed via the above opening of the silicon oxide film 202 is doped with antimony by means of gas-phase diffusion using antimony oxide ($Sb_2O_3$) as a solid diffusion source thereby forming an n$^+$ buried layer 203. The diffusion conditions are selected such that the resultant buried collector layer 203 has a sheet resistance $\rho s$=20 to 50 $\Omega/\square$ and has a depth Xj=1 $\mu$m to 2 $\mu$m.

Figure 7B:
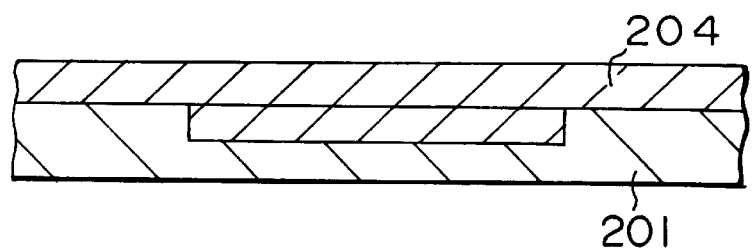

Subsequently, as shown in FIG. 7B, the silicon oxide 202 is removed and a semiconductor layer 202 of an n-type silicon having a resistivity of 0.3 $\Omega$cm to 5.0 $\Omega$cm and a thickness of 0.7 $\mu$m to 2.0 $\mu$m is formed on the silicon substrate 201 by means of an epitaxial growth technique.

Figure 7C:
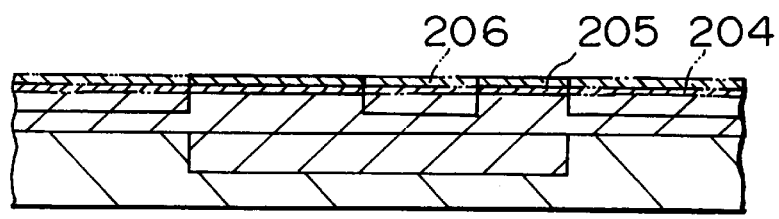

The surface of the semiconductor layer 204 is then oxidized to form a buffer oxide film 205, and then a silicon nitride film 206 is formed on the surface of the buffer oxide film 205 by means of a reduced-pressure CVD technique, as shown in FIG. 7C. The thicknesses of these films are selected taking into account the length of the bird's beak of a LOCOS oxide film which will be formed in a later processing step and also the stress and the defects which may occur during the LOCOS process. More specifically, the buffer oxide film 205 has a thickness in the range for example from 20 nm to 50 nm, and the silicon nitride film 206 has a thickness in the range for example from 50 nm to 100 nm. Etching is then performed using a resist pattern (not shown) as a mask to partially remove the silicon nitride film 206 and the buffer oxide film 205 in such a manner as to form openings at locations represented by the two-dot chain line where an LOCOS film is to be formed. The portions of the semiconductor layer 204 exposed via the above openings are etched to a depth equal to about half the thickness of the LOCOS oxide film which will be formed later so that the surface of the substrate will become flat when the LOCOS oxide film is formed.

Figure 7D:
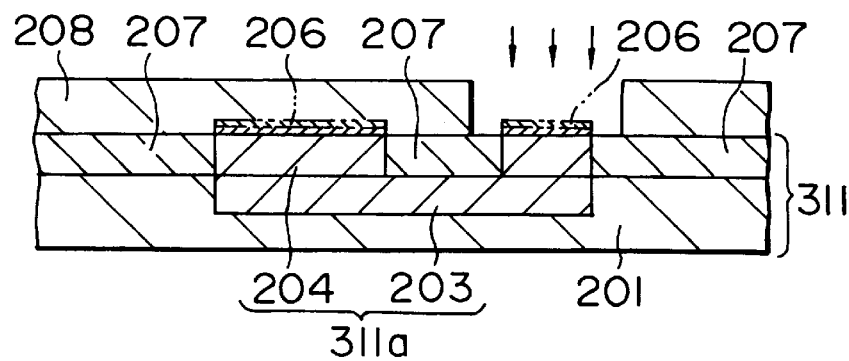

Subsequently as shown in FIG. 7D, steam oxidation is performed at 1000° C. to 1050° C. for 2 to 6 hours to form a LOCOS oxide film 207 having a thickness of 0.8 $\mu$m to 1.5 $\mu$m on the surface of the semiconductor layer 204 in the areas exposed via the openings of the silicon nitride film 206. The portions of the semiconductor layer 204 remaining without being oxidized by the LOCOS process and the n$^+$ buried layer 203 form an n-type collector layer 311a. Thus, the silicon substrate 201, the collector layer 311a, and the LOCOS oxide film 207 form a substrate 311.

The silicon nitride film 206 is removed by means of wet etching with hot phosphoric acid. A resist pattern having an opening at the location where a collector contact region connected to the collector layer 311a is formed on the substrate 311. Ion implantation is then performed using the resist pattern 208 as a mask so as to incorporate an n-type impurity into the surface region of the collector layer 311a thereby forming the collector contact region. Phosphorus may preferably used as the n-type impurity. Preferable ion implantation conditions are 40 keV to 100 kev for the ion implantation energy and $10^{15}$ ions/cm$^2$ to $10^{16}$ ions/cm$^2$ for the dose.

The resist pattern 208 is removed, and a silicon oxide film having a thickness 100 nm to 600 nm (not shown) is formed on the substrate 311 by means of CVD. Subsequently, annealing is performed to activate the phosphorus atoms which have been incorporated into the surface region of the substrate 311 during the above ion implantation process. A resist film (not shown) is then coated on the above silicon oxide film, and this resist film and the silicon oxide film are etched over the entire area by means of an RIE (reactive ion etching) technique until the collector layer 311a is exposed, thereby planarizing the surface of the substrate 311.

Figure 7E:
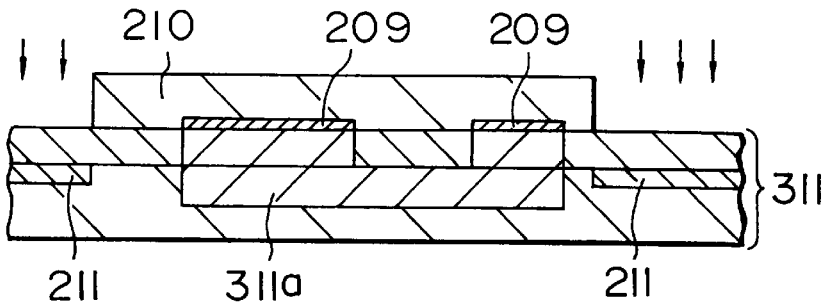
Figure 7F:
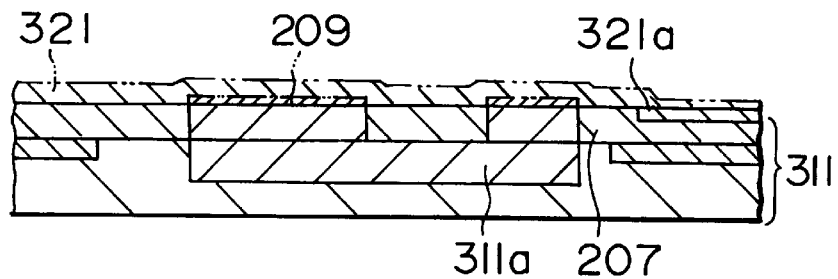

After that, as shown in FIG. 7E, thermal oxidation is performed at about 900° C. so that an oxide film 209 having a thickness of 10 to 30 nm on the exposed surface of the collector layer 311a on the primary surface of the substrate 311. A resist pattern 210 is then formed on the substrate 311, ion implantation is performed using the resist pattern 210 as a mask so as to partially incorporating p-type impurity atoms into the substrate 311 thereby forming device isolation regions 211. The resist pattern 210 is then removed.

After the above-described processing steps, the steps shown in FIGS. 7F–7J are performed as described below, wherein these steps characterize the third embodiment of the invention.

First, a resist pattern (not shown) having an opening at the location corresponding to the region where the resistor is to be formed is formed on the substrate 311 on which the collector layer 311a has been formed in the previous steps. An RIE process is then performed using this resist pattern as a mask in such a manner as to etch the LOCOS oxide film 207 on the substrate 311 to a depth of 200 nm to 300 nm thereby forming a recessed portion on the surface of the substrate 311.

The above resist pattern is removed, and a polysilicon film 321 is formed on the primary surface of the substrate 311 by means of CVD. The thickness of the polysilicon film 321 is selected such that the recessed portion on the substrate 311 is fully embedded with the polysilicon film 321. In this specific example, the thickness is within the range from 200 nm to 300 nm. The polysilicon film 321 is then doped with an impurity such as boron by means of ion implantation. The dose of the implanted boron ions is selected such that the resultant polysilicon film 321 will have a desired resistance. A high-temperature heat treatment is then performed at 900° C. to 1100° C. so as to activate the impurity atoms incorporated in the polysilicon film 321 thereby forming an polysilicon film 321 containing activated impurity on the substrate 311.

Alternatively, the polysilicon film 321 may also be formed by depositing a polysilicon film by means of CVD and then incorporating an impurity into it by means of a plasma doping technique. Still alternatively, the polysilicon film 321 may also be formed by incorporating an impurity into the polysilicon film during the CVD process for depositing the polysilicon film 321 thereby forming a polysilicon film 321 containing activated impurity atoms (doped polysilicon).

A CMP (chemical mechanical polishing) process is performed using the oxide film 209 as a stopper so that the portion of the polysilicon film 321 denoted by the two-dot chain line is removed thereby planarizing the surface of the substrate 311. As a result, a resistor element is formed with the polysilicon layer 321a in such a manner that the resultant resistor element is embedded in the recessed region on the surface of the substrate 311.

Alternatively, the polysilicon layer 321a may also be disposed on the surface of the substrate 311 instead of embedding it in the recessed portion. In this case, the polysilicon layer 321a may be formed by depositing a polysilicon layer on the substrate 311 and then patterning it by means of RIE using a resist pattern as a mask.

Figure 7G:
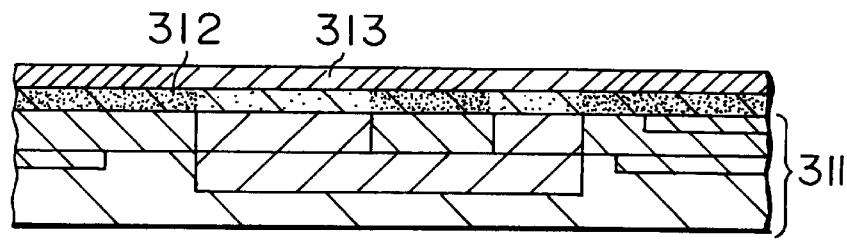

Subsequently, as shown in FIG. 7G, the surface of the substrate 311 is cleaned and a first semiconductor layer 312 is grown on the substrate by means of an epitaxial growth technique such as MBE (molecular beam epitaxy), gas-source MBE, UHV (ultra-high vacuum)-CVD, or LP (low pressure)-CVD. This first semiconductor layer 312 is formed of SiGe (silicon germanium) or Si (silicon) containing a p-type impurity. To maintain the surface clean, a second semiconductor layer 313 is subsequently grown on the first semiconductor layer 312 by means of an epitaxial growth technique. The second semiconductor layer 313 is formed of Si containing an n-type impurity. In the above process, the first and second semiconductor layers 312 and 313 are grown in a single-crystal form in those areas where the first semiconductor layer 312 comes into direct contact with the underlying layer of single-crystal silicon. On the other hand, the first and second semiconductor layers are grown in a polycrystalline form in those areas where the layer immediately under the first semiconductor layer is either an oxide film (LOCOS film 207) or a polysilicon layer 321a.

Figure 7H:
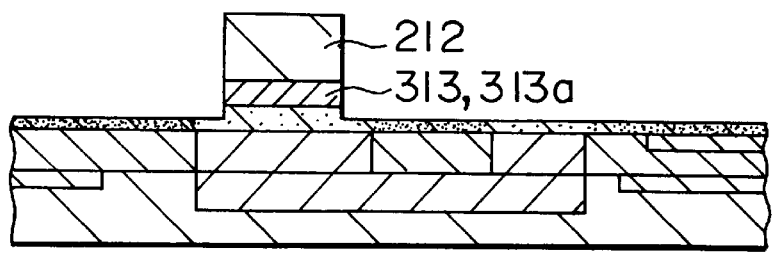

After the above process, as shown in FIG. 7H, a resist pattern 212 is formed on the second semiconductor layer 313, and the second semiconductor layer 313 is etched using the resist pattern 212 as a mask thereby forming an emitter layer 313a with the second semiconductor layer 313.

Figure 7I:
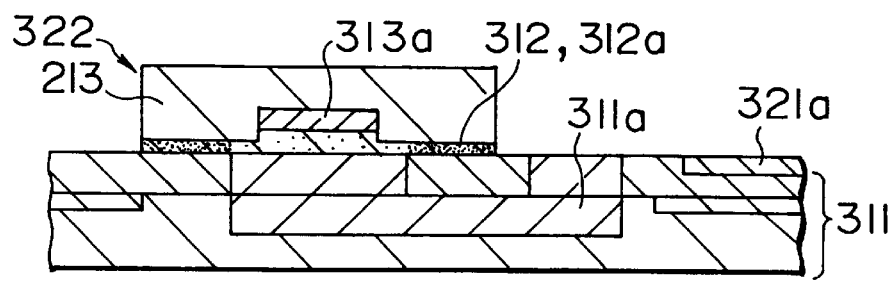

Furthermore, as shown in FIG. 7I, the resist pattern 212 is removed and another resist pattern 213 is formed on the first semiconductor layer 312 such that the area where a base layer is to be formed is covered with the resist pattern 213. The first semiconductor layer 312 is then etched using the resist pattern 213 as a mask thereby forming a base layer 312a with the first semiconductor layer 312.

Thus, the resistor formed of the polysilicon layer 321 and the mesa-type bipolar transistor 322 composed of the collector layer 311a formed on the primary side of the substrate 311, the base layer 312a formed on the substrate 311 in such a manner that the base layer 312a is in direct contact with the collector layer 312a, and the emitter layer 313a formed on the base layer 312a are obtained on the primary surface of the same substrate 311.

Figure 7J:
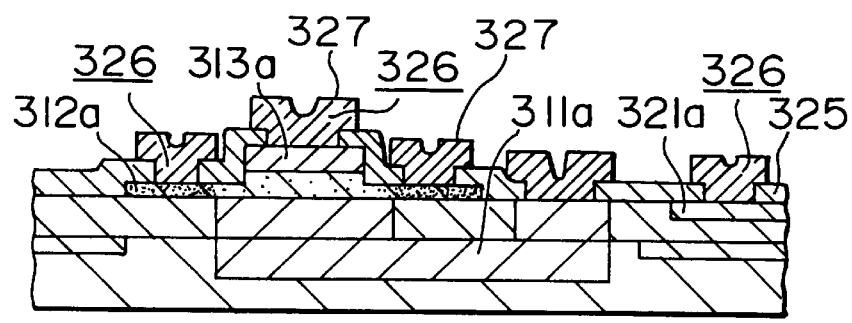

The resist pattern 213 is then removed and as shown in FIG. 7J an insulating film 325 having a thickness of about 300 nm is formed on the substrate 311 by means of CVD in such a manner that the emitter layer 313a and the base layer 312a are covered with the insulating layer 325. A resist pattern (not shown) is then formed on the insulating film 325. Using this resist pattern as a mask, the insulting film 325 is etched by means of an RIE process to form contact holes 326 in such a manner that they extend to the collector layer 311a, the base layer 312a, the emitter layer 313a, and the polysilicon layer 321a.

The above resist pattern is removed, and a barrier metal (not shown) and aluminum are successively deposited by means of sputtering. Another resist pattern (not shown) is formed, and the aluminum and the barrier metal are etched by means of an RIE process using the above resist pattern as a mask so as to form interconnections 327 in contact with the collector layer 311a, the base layer 312a, the emitter layer 313a, and the polysilicon layer 321a, respectively.

In this method of fabricating a semiconductor device according to the present embodiment, the polysilicon layer 321a is first formed on the primary surface of the substrate 311 as described above with reference to FIG. 7F, and then the base layer 312a of the bipolar transistor is formed thereon as described above with reference to FIGS. 7G–7I. Therefore, the base layer is formed without being affected by the heat treatment required to activate the impurity atoms incorporated in the polysilicon layer 321a. Thus, the crystallinity and impurity profile of the base layer 321 are maintained unchanged in the state as formed. This makes it possible to obtain a bipolar transistor having a base layer with a sufficiently narrow width and a sufficiently high impurity concentration to operate at a high speed. Furthermore, it is possible to form such the bipolar transistor together with a resistor element composed of the polysilicon layer 321a on the same substrate 311.

Figure 8A:
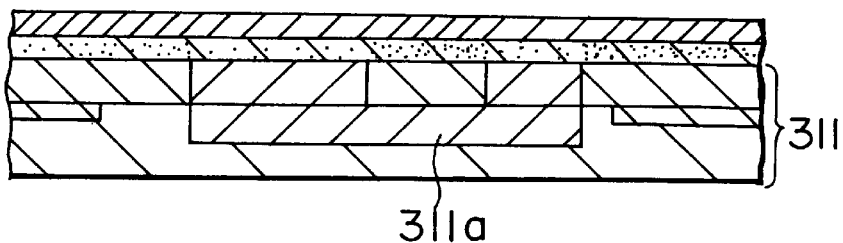
FIG. 8A–8E is a schematic representation of the processing steps of producing a semiconductor device according to a fourth embodiment of the present invention.
Figure 8B:
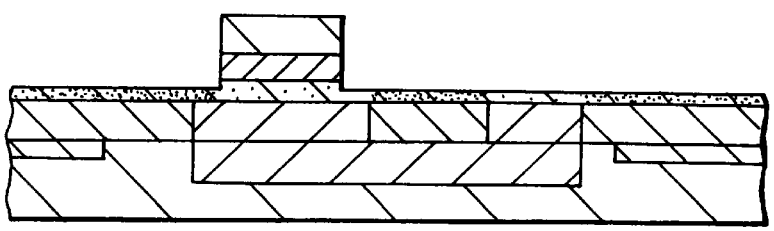
Figure 8C:
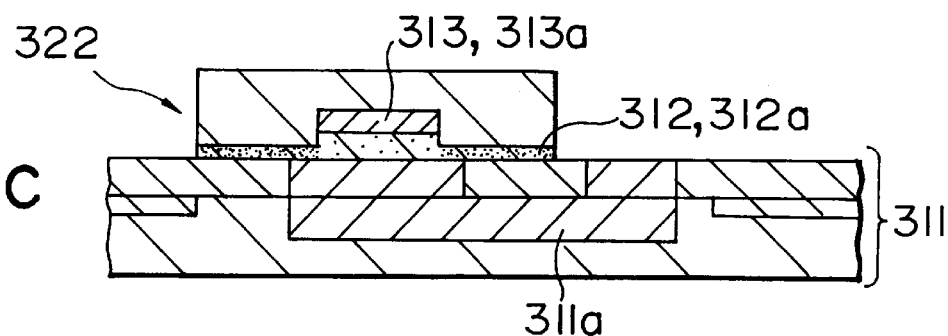
Figure 8D:
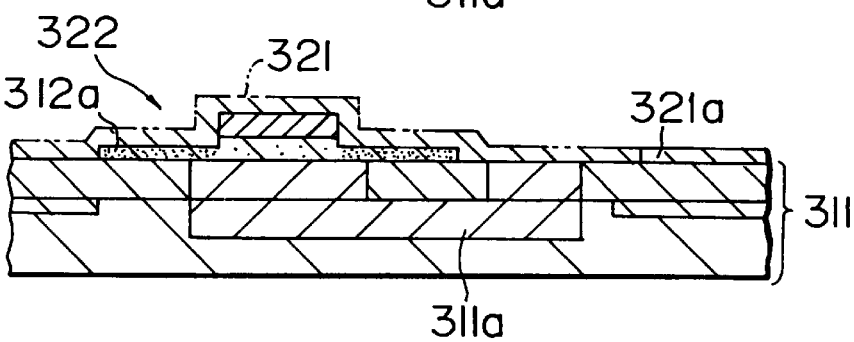
Figure 8E:
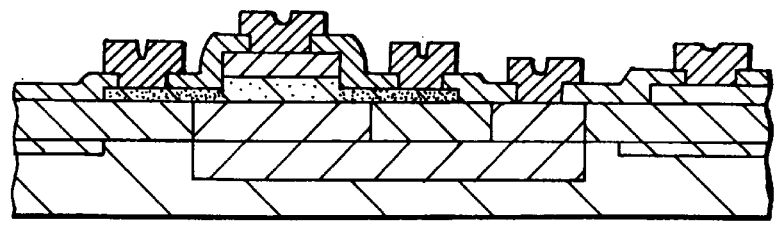

FIG. 8 illustrates the processing steps of fabricating a semiconductor device according to a fourth embodiment of the invention, wherein the semiconductor device is formed on a substrate 311 as shown in FIG. 8E. The substrate 311 is prepared in the same manner as in the third embodiment described above with reference to FIGS. 7A–7E.

The processing steps of forming a bipolar transistor together with a resistor element of polysilicon on the primary surface of the substrate 311 on which a collector layer 311a has already been formed according to the above process will now be described below.

According to a similar procedure to that employed in the third embodiment described above with reference FIGS. 7G–7I, a first semiconductor layer 312 (of SiGe or Si) is grown by means of an epitaxial growth technique and then patterned so as to form a base layer 312a, and then a second semiconductor layer 313 is formed on the first semiconductor layer 312 and patterned so as to form an emitter layer 313a as shown in FIGS. 8A–8C. As a result a mesa-type bipolar transistor 322 is obtained which is composed of the collector layer 311a formed on the surface of the substrate 311, the base layer 312a formed on the collector layer 311a, and the emitter layer 313a formed on the base layer 312a.

After the above process, as shown in FIG. 8D, a polysilicon film 321 is formed in such a manner that the collector layer 311a, the base layer 312a, and the emitter layer 313a are covered with the polysilicon film. The polysilicon film 321 may be formed by means of for example a CVD technique using a deposition gas mixed with a doping gas so that the resultant polysilicon film 321 contains an impurity and has a thickness of 200 nm to 300 nm. The doping level is selected such that the resultant polysilicon film 321 can provide a desired resistance.

Alternatively, the polysilicon film 321 may also be formed by first depositing an undoped polysilicon film 321 by means of CVD and then incorporating activated impurity atoms into the film 321 by means of plasma doping.

The polysilicon film 321 is then covered with a resist pattern (not shown) and patterned by means of etching using the resist pattern as a mask so as to form a polysilicon layer 321a on the substrate 311 in such a manner that the resultant polysilicon layer 321a is isolated from the collector layer 311a, the base layer 312a, and the emitter layer 313a.

Alternatively, the polysilicon layer 321a may also be formed in such a manner that it is embedded in the recessed portion on the primary surface of the substrate 311 as in the third embodiment described above. The polysilicon layer 321a in such the form may be obtained according to the processing steps described above in the third embodiment with reference to FIG. 7F.

Thus, the bipolar transistor 322 and the resistor element composed of the polysilicon layer 321a are formed on the surface of the same substrate 311. The processing steps following the above may be performed in the same manner as in the third embodiment described above with reference to FIG. 7J. Thus, a semiconductor device having the structure shown in FIG. 8E is obtained.

In this method of fabricating a semiconductor device, as described above with reference to FIG. 8D, the polysilicon film 321 containing activated impurity atoms can be formed at a low temperature without having to perform an additional activation annealing process. Therefore, in this technique of the present embodiment, the crystallinity and impurity profile of the collector layer 311a, the base layer 312a, and the emitter layer 313a which have already been formed are maintained substantially unchanged during the process of forming the polysilicon layer 321a. This makes it possible to realize a bipolar transistor having a base layer with a sufficiently narrow width and a sufficiently high impurity concentration to operate at a high speed. Furthermore, it is possible to form such the bipolar transistor together with the resistor element composed of the polysilicon layer 321a on the same substrate 311.

Although the invention has been described with reference to the preferred embodiments, the invention is not meant to be limited to the details described above. For example, the semiconductor device element may be of any type as long as it includes a low-resistance polysilicon layer, such as a MOS transistor whose gate electrode is formed of a polysilicon layer, a bipolar transistor whose emitter, base, or collector electrode is formed of a polysilicon layer, etc. Furthermore, although the bipolar transistor is assumed to be of the npn type in the embodiments described above, the invention can also be applied to the pnp bipolar transistor. In this case, the conductivity types of the respective layers should be inverted.

In the present invention, as described above, the emitter contact layer having a high impurity concentration is formed at a low temperature by means of the plasma doping or solid-state diffusion without having to perform high-temperature heat treatment which can result in diffusion of impurities in the base layer. This makes it possible to achieve a base layer having a small thickness and a high impurity concentration, and thus a high-speed bipolar transistor can be realized.

Furthermore, in the method of fabricating a semiconductor device according to the present invention, since a base layer of a mesa-type bipolar transistor is formed on the substrate after forming a polysilicon layer containing activated impurity atoms on the surface of a substrate, the base layer can be formed without being affected by the heat treatment for activating the impurity atoms in the polysilicon layer. Thus, the crystallinity and impurity profile of the base layer are maintained unchanged in the state as formed. This makes it possible to produce an integrated circuit including: a high-speed bipolar transistor whose base layer is thin in thickness and high in impurity concentration; and another device element including a polysilicon layer having a low resistance, wherein the bipolar transistor and the device element are formed on the surface of the same substrate.

In the method of producing a semiconductor device according to the present invention, the polysilicon layer is formed on the substrate on which the mesa-type bipolar transistor has already been formed is formed either by first depositing a polysilicon film containing an activated impurity and then patterning this polysilicon film or by first performing plasma doping so as to incorporate an activated impurity into a polysilicon film which has been deposited previously and then patterning the polysilicon film. This technique allows the polysilicon layer to be formed without changing the crystallinity and impurity profiles of the respective layers of the bipolar transistor. This makes it possible to produce an integrated circuit including: a high-speed bipolar transistor whose base layer is thin in thickness and high in impurity concentration; and another device element including a polysilicon layer having a low resistance, wherein the bipolar transistor and the device element are formed on the surface of the same substrate.

What is claimed is:

1. A method for making a bipolar transistor comprising the steps of:

providing a semiconductor substrate having a surface;

forming a device isolation layer on the surface for Isolating device regions;

forming a polysilicon film on the surface and device isolation layer;

forming at least one opening in the polysilicon film at a location corresponding to a said device isolation region;

forming a base semiconductor film layer having a first conductivity type on the polysilicon film and surface;

forming an emitter semiconductor film layer having a first concentration of impurity of a second conductivity type different from the first conductivity type on the base semiconductor film layer;

forming a dielectric film on the emitter semiconductor film layer, said dielectric film having a higher concentration of impurity of the second conductivity type than is present in said emitter semiconductor film layer;

performing solid-state diffusion so that impurities from the dielectric film diffuse into the emitter semiconductor film layer so that the concentration of impurities of the second conductivity type Is increased above the first concentration in a surface region of the emitter semiconductor film layer;

patterning the dielectric film to provide an etching mask; and thereafter, patterning the surface region of the emitter semiconductor film layer by etching using the etching mask to form an emitter contact layer and patterning remaining portions of the emitter semiconductor film layer by etching using the etching mask to form an emitter.

2. A method for making a semiconductor device including a bipolar transistor and a device element including a polysilicon layer doped with an impurity on a common substrate, said method comprising the steps of:

providing a substrate having a surface;

forming a polysilicon layer doped with an Impurity on the surface; and thereafter, forming a base layer of the bipolar transistor by epitaxially growing a silicon-germanium compound semiconductor layer containing an activated impurity on the substrate and patterning said semiconductor layer.

3. A method as defined in claim 2, wherein the step of forming said polysilicon layer doped with an impurity comprises the steps of forming a polysilicon layer on the surface and plasma doping the polysilicon layer to incorporate activated impurity into the polysilicon layer to form said impurity doped polysilicon layer.

4. A method for making a bipolar transistor, according to claim 1, wherein said base semiconductor film layer comprises a silicon-germanium compound semiconductor.

5. A method for making a semiconductor device, according to claim 2, wherein said device element comprises a resistor element.

* * * * *